(12) United States Patent
Chan et al.

(10) Patent No.: US 7,679,081 B2
(45) Date of Patent: Mar. 16, 2010

(54) SUBSTRATE STRUCTURES AND FABRICATION METHODS THEREOF

(75) Inventors: Lih-Hsiung Chan, Kaohsiung (TW); Ming-Chun Hsiao, Hsinchu (TW); Wei-Ling Lin, I-Lan Hsien (TW); Gary Wei, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/625,791

(22) Filed: Jan. 22, 2007

(65) Prior Publication Data

US 2008/0054255 A1    Mar. 6, 2008

(30) Foreign Application Priority Data

Aug. 29, 2006    (TW)    ............................... 95131702 A

(51) Int. Cl.
*H01L 35/24*    (2006.01)
*H01L 51/00*    (2006.01)
(52) U.S. Cl. .................. 257/40; 257/E51.001
(58) Field of Classification Search ............ 257/40; 428/900
See application file for complete search history.

(56) References Cited

U.S. PATENT DOCUMENTS

| | | | |
|---|---|---|---|
| 6,686,827 B2 * | 2/2004 | Chen et al. ............ | 338/22 R |
| 2002/0050769 A1 * | 5/2002 | Pelrine et al. ............ | 310/363 |
| 2003/0006669 A1 * | 1/2003 | Pei et al. ............ | 310/309 |
| 2003/0141473 A1 * | 7/2003 | Pelrine et al. ............ | 251/129.06 |
| 2004/0022677 A1 * | 2/2004 | Wohlstadter et al. ............ | 422/52 |
| 2004/0041154 A1 * | 3/2004 | Watanabe et al. ............ | 257/77 |
| 2004/0099438 A1 * | 5/2004 | Arthur et al. ............ | 174/257 |
| 2004/0166235 A1 * | 8/2004 | Fujii et al. ............ | 427/77 |
| 2004/0182707 A1 * | 9/2004 | Jardemark et al. ............ | 204/451 |
| 2005/0000565 A1 * | 1/2005 | Zeng ............ | 136/256 |
| 2005/0029514 A1 * | 2/2005 | Moriya ............ | 257/40 |
| 2006/0180807 A1 * | 8/2006 | Bechtel et al. ............ | 257/40 |

FOREIGN PATENT DOCUMENTS

TW    I230029    3/2005

* cited by examiner

*Primary Examiner*—Kenneth A Parker
*Assistant Examiner*—Anthony Ho
(74) *Attorney, Agent, or Firm*—Quintero Law Office

(57) ABSTRACT

Substrate structures and fabrication methods thereof. A substrate structure includes a bendable substrate and an inorganic electrode structure on the bendable structure, wherein the inorganic electrode structure includes a conductive layer or a semiconductor layer. The inorganic electrode structure includes carbon nanotubes, carbon nanofibers, a nanolinear material, or a micro-linear material. The bendable substrate includes polyethylene (PE), polyimide (PI), polyvinyl alcohol (PVA), or polymethyl methacrylate (PMMA).

2 Claims, 6 Drawing Sheets

SUBSTRATE STRUCTURES AND FABRICATION METHODS THEREOF

BACKGROUND OF THE INVENTION

1. Field of the Invention

The invention relates to substrate structures and fabrication methods thereof, and more particularly to bendable polymer substrate with inorganic electrode structures and fabrication methods thereof.

2. Description of the Related Art

In some electronic device applications, substrates have to be bendable and flexible in order to fit in non-planar base or portable applications unsuited to use of conventional hard substrate structures. Organic or polymer flexible substrate structures, more specifically, with one-dimensional conductive materials such as carbon nanotubes, carbon nanofibers, a nanolinear material, or a micro-linear material have to be formed at above 400° C.-500° C. Flexible soft substrates cannot sustain the high temperature process, thus inorganic electrode structures cannot be directly formed on an organic polymer substrate.

Conventional flexible electronic devices are achieved by forming organic conductive materials such as polyethylenedioxythiophene (PEDOT) on polymer substrate. However, the electric properties and stability of the organic conductive materials cannot compete with the inorganic conductive materials. The inorganic conductive materials are also more durable than the organic conductive materials. It is difficult to directly form inorganic conductive materials on a polymer substrate. Therefore, conventional organic conductive materials on polymer substrate cannot meet requirements of flexibility, electrical properties and durability.

BRIEF SUMMARY OF THE INVENTION

Accordingly, the invention is directed to inorganic one-dimensional linear conductive materials on bendable and flexible polymer substrate structures, thereby maintaining required electrical properties and flexibility.

The invention provides a substrate structure comprising a bendable substrate and an inorganic electrode structure thereon, wherein the inorganic electrode structure comprises a conductive layer or a semiconductor layer.

The invention further provides a method for fabricating a substrate structure. A first substrate is provided. An inorganic electrode structure is formed on the first substrate by screen printing. A bendable polymer substrate is applied on the first substrate covering the inorganic electrode structure. The bendable polymer substrate is released from the first substrate such that the inorganic electrode structure is attached to the bendable substrate.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a method for transferring inorganic one-dimensional conductive material, such as carbon nanotubes, carbon nanofibers, a nanolinear material, or a micro-linear material on a bendable polymer substrate, serving as an electrode layer or a semiconductor layer. In terms of electrical properties, inorganic electrode materials are superior to conventional organic electrode on polymer substrate, maintaining desired electrical properties and flexibility.

Figure 1:
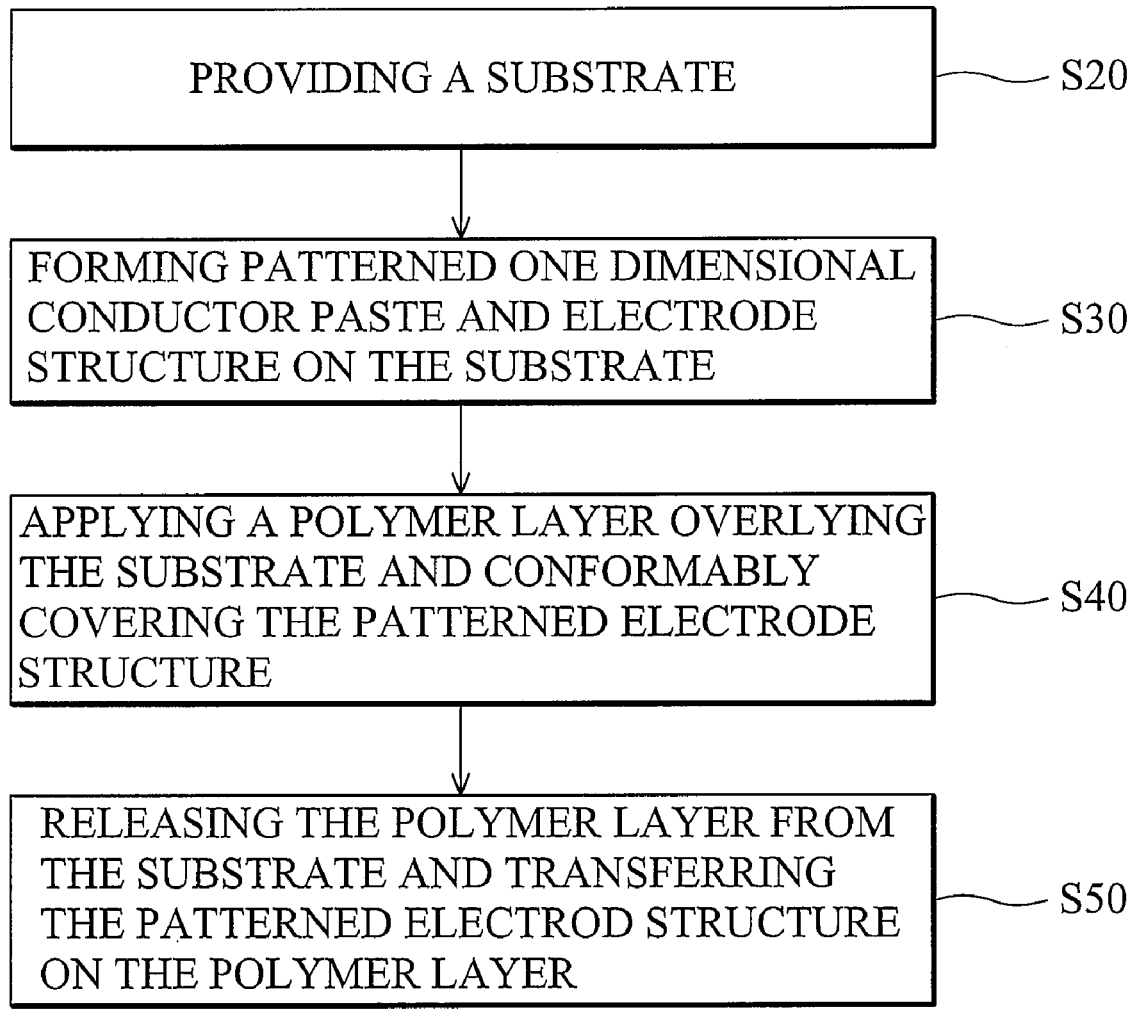
FIG. 1 is a flowchart illustrating an exemplary embodiment of fabrication of an organic polymer substrate structure of the invention.

FIG. 1 is a flowchart illustrating fabrication steps of an exemplary embodiment of a substrate structure of the invention. In step S20, a substrate for transferring an inorganic electrode pattern is provided. Selections of the substrate are not limited thereto. In step S30, patterned one-dimensional conductor paste and electrode structure are formed on the substrate. The one-dimensional conductive material comprises carbon nanotubes, carbon nanofibers, a nanolinear material, or a micro-linear material. For example, the one-dimensional conductive material can be fabricated by arc discharging, chemical vapor deposition (CVD), or laser ablation. The CNT powders are gathered in a container. The gathered one-dimensional conductive materials are mixed into a paste and formed into a patterned electrode structure on the substrate by screen printing.

In step S40, a polymer layer is applied overlying the substrate and conformably covering the patterned electrode structure. The polymer layer is formed by casting chemical solution comprising polyethylene (PE), polyimide (PI), polyvinyl alcohol (PVA), polymethyl methacrylate (PMMA) on the substrate and then solidified. In step S50, the polymer layer is released from the substrate and the patterned electrode structure transferred onto the polymer layer.

Figure 2A:
FIGS. 2A-2D are cross sections illustrating an exemplary embodiment of fabricating a substrate structure of the invention.
Figure 2B:
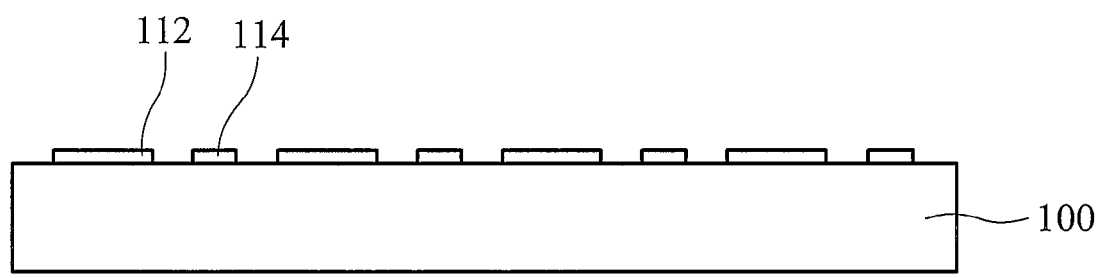

FIGS. 2A-2D are cross sections illustrating an exemplary embodiment of steps for fabricating a substrate structure of the invention. Referring to FIG. 2A, a transferring substrate 100 is provided. Since the transferring substrate 100 is configured as a means for transferring an electrode pattern, the structure and composition of the transferring substrate 100 are not limited thereto. Referring to FIG. 2B, a patterned cathode structure is formed on the transferring substrate 100. The patterned electrode structure can be a planar electrode structure or a stereo electrode structure. For example, a planar parallel electrode structure shown in FIG. 2B comprises a first electrode 112 and a second electrode 114 parallel to each other. The first and second electrodes 112 and 114 comprise one-dimensional conductive materials such as carbon nanotubes, carbon nanofibers, a nanolinear material, or a micro-linear material. The one-dimensional conductive materials are mixed and blended into paste, and thus printed on the transferring substrate 100.

Figure 2C:
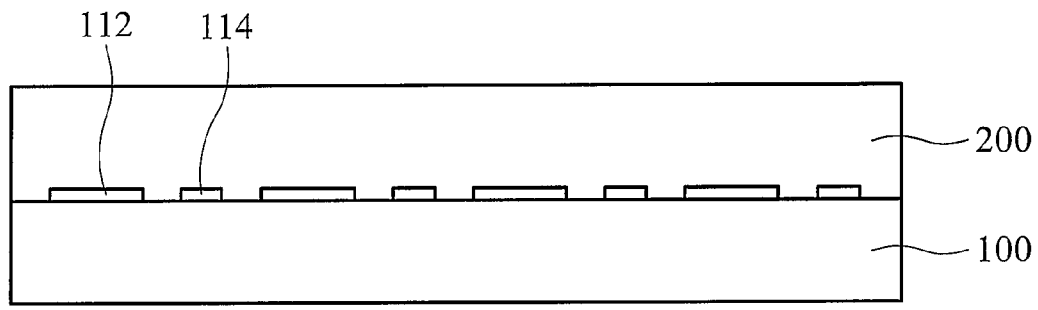
Figure 2D:
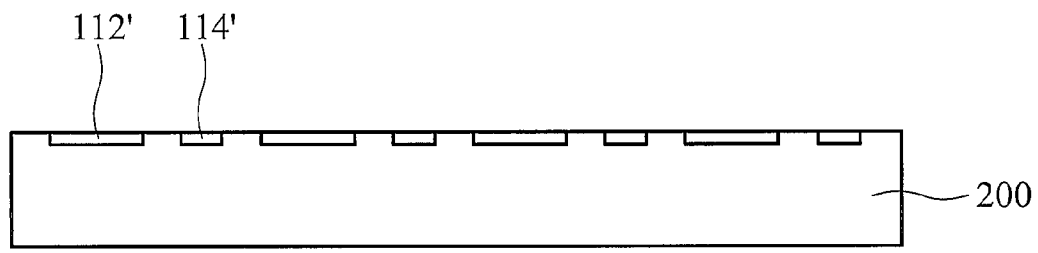

Referring to FIG. 2C, a polymer layer 200 is applied overlying the transferring substrate 100 and conformably covering the patterned cathode structure. For example, the polymer layer is formed by casting chemical solution comprising polyethylene (PE), polyimide (PI), polyvinyl alcohol (PVA), polymethyl methacrylate (PMMA) on the transferring substrate 100 and then solidified. The first and second electrodes 112 and 114 on the transferring substrate 100 are converted on the corresponding first and second electrodes 112' and 114' on the polymer layer 200. Referring to FIG. 2D, the polymer layer 200 is released from the transferring substrate 100 and the corresponding electrodes 112' and 114' transferred onto the polymer layer 200, whereby the substrate structure is maintained with desired electrical properties and flexibility.

Figure 3A:
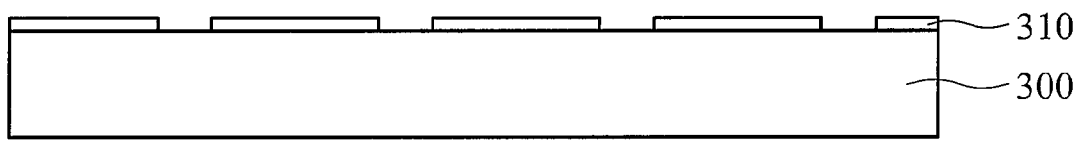
FIGS. 3A-3E are cross sections illustrating another exemplary embodiment of fabricating a substrate structure of the invention.

FIGS. 3A-3E are cross sections illustrating another exemplary embodiment of steps for fabricating a substrate structure of the invention. Referring to FIG. 3A, a transferring substrate 300 is provided. Since the transferring substrate 300 is configured as a means for transferring an electrode pattern, the structure and composition of the transferring substrate 300 are not limited thereto. An electrode 310 is formed on the transferring substrate 300. The electrode 310 comprises one-dimensional conductive materials such as carbon nanotubes, carbon nanofibers, a nanolinear material, or a micro-linear material. The one-dimensional conductive materials are mixed and blended into paste, and thus printed on the transferring substrate 100.

Figure 3B:
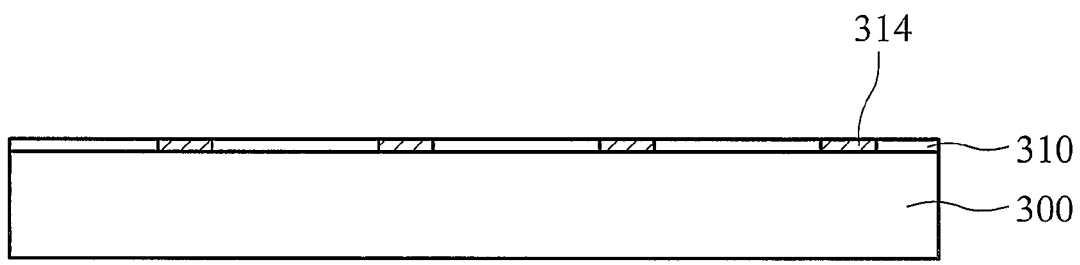

Referring to FIG. 3B, a stereo convex structure 314 is formed on the transferring substrate 300.

Figure 3C:
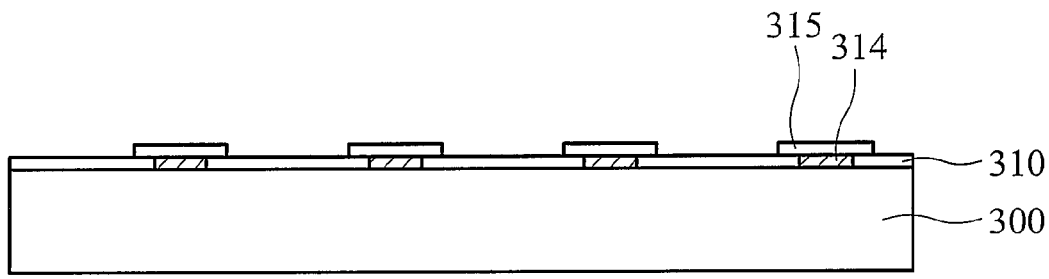

Referring to FIG. 3C, an electrode 315 is formed on the stereo convex structure 314. The electrode 315, the stereo convex structure 314 and the electrode 315 are composed of a stereo electrode structure. The stereo electrode structure on the transferring substrate 300 is complementary with the desirable electrode structure on the polymer substrate.

Figure 3D:
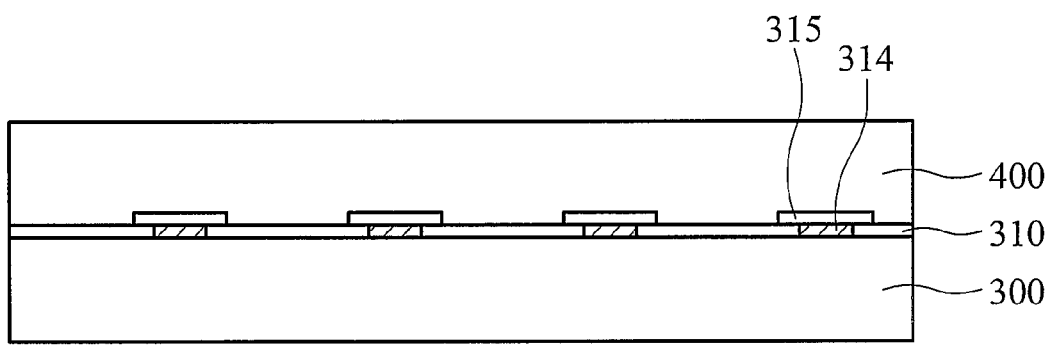

Referring to FIG. 3D, a polymer layer 400 is applied overlying the transferring substrate 300 and conformably covering the stereo electrode structure. For example, the polymer layer is formed by casting chemical solution comprising polyethylene (PE), polyimide (PI), polyvinyl alcohol (PVA), polymethyl methacrylate (PMMA) on the transferring substrate 300 and then solidified. The adhesion between the polymer layer 400 and the electrodes 310 and 315 is stronger than the transferring substrate 300 and the electrodes 310 and 315.

Figure 3E:
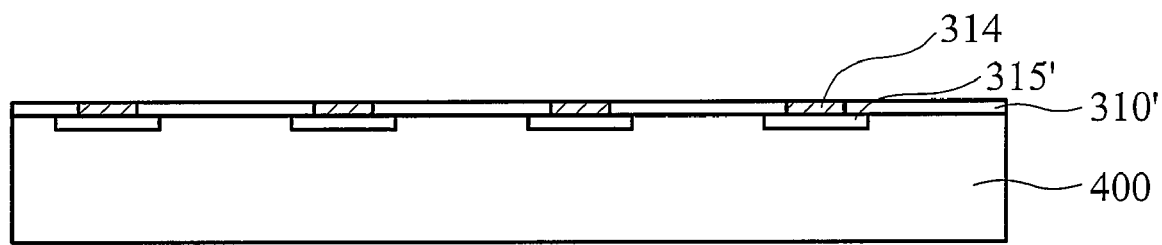

Referring to FIG. 3E, the polymer layer 400 is released from the transferring substrate 300 and the stereo electrode structure transferred onto the polymer layer 400. Since the adhesion between the polymer layer 400 and the electrodes 310 and 315 is strong, the corresponding electrodes 310' and 315' are transferred onto the flexible polymer layer 400. The substrate structure is therefore maintained with desired electrical properties and flexibility. Note that the original stereo electrode structure on the transferring substrate is complementary with the corresponding stereo electrode structure on the polymer layer 400.

The substrate structure is applicable to flexible electronic devices, such as radio frequency identification (RFID), flexible printing circuits (FPCs), flexible display devices including organic thin film transistor (OTFT), and field emission display, but is not limited thereto.

The invention provides an electrode structure bearing one-dimensional conductive materials such as carbon nanotubes, carbon nanofibers, a nanolinear material, or a micro-linear material can be indirectly formed on the flexible polymer substrate, thereby maintaining desired electrical properties and flexibility.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A substrate structure, comprising:
   a bendable substrate;
   an inorganic electrode structure transferred from a transferring substrate onto the bendable substrate such that the inorganic electrode structure is indented into the bendable substrate, and a top surface of the inorganic electrode is level with a top surface of the bendable substrate;
   a plurality of auxiliary electrodes on the bendable substrate and adhered with the inorganic electrode structure; and
   a structural layer disposed on the inorganic electrode structure and between the auxiliary electrodes, wherein a top surface of the structural layer is coplanar with top surfaces of the auxiliary electrodes,
   wherein the inorganic electrode structure comprises a conductive layer or a semiconductor layer, and
   wherein the bendable substrate comprises polyethylene (PE), polyimide (PI), polyvinyl alcohol (PVA), or polymethyl methacrylate (PMMA).

2. The substrate structure according to claim 1, wherein the inorganic electrode structure comprises carbon nanotubes, or carbon nanofibers.

* * * * *